United States Patent
Abrams et al.

(10) Patent No.: US 7,793,253 B2
(45) Date of Patent: Sep. 7, 2010

(54) MASK-PATTERNS INCLUDING INTENTIONAL BREAKS

(75) Inventors: Daniel S. Abrams, Mountain View, CA (US); Danping Peng, Fremont, CA (US); Yong Liu, Fremont, CA (US); Paul Rissman, Palo Alto, CA (US)

(73) Assignee: Luminescent Technologies, Inc., Palo Alto, CA (US)

(*) Notice: Subject to any disclaimer, the term of this patent is extended or adjusted under 35 U.S.C. 154(b) by 431 days.

(21) Appl. No.: 11/538,782

(22) Filed: Oct. 4, 2006

(65) Prior Publication Data

US 2007/0196742 A1    Aug. 23, 2007

Related U.S. Application Data

(60) Provisional application No. 60/723,843, filed on Oct. 4, 2005.

(51) Int. Cl.
G06F 17/50    (2006.01)
(52) U.S. Cl. ............................ 716/19; 716/21
(58) Field of Classification Search ............. 716/19–21; 430/5, 22, 30
See application file for complete search history.

(56) References Cited

U.S. PATENT DOCUMENTS

| | | |
|---|---|---|
| 4,752,957 A | 6/1988 | Maeda |
| 5,242,770 A | 9/1993 | Chen et al. |
| 5,301,101 A | 4/1994 | MacArthur et al. |
| 5,418,092 A | 5/1995 | Okamoto |
| 5,489,509 A | 2/1996 | Kawabata et al. |
| 5,508,803 A | 4/1996 | Hibbs et al. |
| 5,525,808 A | 6/1996 | Irie et al. |
| 5,546,189 A | 8/1996 | Svetkoff et al. |
| 5,546,225 A | 8/1996 | Shiraishi |
| 5,640,199 A | 6/1997 | Garakani et al. |

(Continued)

FOREIGN PATENT DOCUMENTS

WO    WO 2006/078791 A2    7/2006

(Continued)

OTHER PUBLICATIONS

S. Osher and R. P. Fedkiw, "Level set methods: an overview and some recent results", J. Computational Physics, vol. 169, No. 2, pp. 463 May 20, 2001.

(Continued)

*Primary Examiner*—Jack Chiang
*Assistant Examiner*—Binh C Tat
(74) *Attorney, Agent, or Firm*—Wilson Sonsini Goodrich & Rosati (57) ABSTRACT

A method for determining a mask pattern to be used on a photo-mask in a photolithographic process is described. During the method, a target pattern that includes at least one continuous feature is provided. Then a mask pattern that includes a plurality of distinct types of regions corresponding to the distinct types of regions of the photo-mask is determined. Note that the mask pattern includes at least two separate features corresponding to at least the one continuous feature. Furthermore, at least the two separate features are separated by a spacing having a length and the spacing overlaps at least a portion of at least the one continuous feature.

23 Claims, 7 Drawing Sheets

U.S. PATENT DOCUMENTS

| | | | |
|---|---|---|---|
| 5,707,765 A | 1/1998 | Chen | |
| 5,889,678 A | 3/1999 | Inoue et al. | |
| 6,022,644 A | 2/2000 | Lin et al. | |
| 6,042,998 A | 3/2000 | Brueck et al. | |
| 6,096,567 A | 8/2000 | Kaplan et al. | |
| 6,123,733 A | 9/2000 | Dalton | |
| 6,383,847 B1 | 5/2002 | Ditlow et al. | |
| 6,468,711 B1 | 10/2002 | Sorori et al. | |
| 6,484,306 B1 | 11/2002 | Bokor et al. | |
| 6,563,566 B2 | 5/2003 | Rosenbluth et al. | |
| 6,596,466 B1 | 7/2003 | Pohland et al. | |
| 6,601,192 B1 | 7/2003 | Bowman-Amuah | |
| 6,611,627 B1 | 8/2003 | LaRossa et al. | |
| 6,617,096 B2 | 9/2003 | Burkhard | |
| 6,677,948 B1 | 1/2004 | Wasserman et al. | |
| 6,698,007 B2 | 2/2004 | Wu et al. | |
| 6,703,170 B1 | 3/2004 | Pindo | |
| 6,704,920 B2 | 3/2004 | Brill et al. | |
| 6,733,929 B2 * | 5/2004 | Pierrat | 430/5 |
| 6,756,980 B2 | 6/2004 | Hayashi | |
| 6,764,795 B2 | 7/2004 | Aton et al. | |
| 6,787,271 B2 * | 9/2004 | Cote et al. | 430/5 |
| 6,795,069 B2 | 9/2004 | Raskar et al. | |
| 6,798,412 B2 | 9/2004 | Cowperthwaite | |
| 6,799,313 B2 | 9/2004 | LaCour | |
| 6,809,797 B2 | 10/2004 | Baselmans et al. | |
| 6,880,135 B2 | 4/2005 | Chang et al. | |
| 6,968,532 B2 | 11/2005 | Sivakumar et al. | |
| 7,027,658 B2 | 4/2006 | Osher et al. | |
| 7,031,538 B2 | 4/2006 | Osher et al. | |
| 7,073,162 B2 | 7/2006 | Cobb et al. | |
| 7,124,394 B1 | 10/2006 | Abrams et al. | |
| 7,175,945 B2 * | 2/2007 | Mieher et al. | 430/5 |
| 7,178,127 B2 | 2/2007 | Abrams et al. | |
| 7,231,628 B2 | 6/2007 | Pack et al. | |
| 7,236,123 B2 | 6/2007 | Siegel | |
| 7,302,090 B2 | 11/2007 | Kalus et al. | |
| 7,353,145 B2 | 4/2008 | Tanaka et al. | |
| 7,403,641 B2 | 7/2008 | Nakamoto et al. | |
| 7,441,227 B2 | 10/2008 | Abrams et al. | |
| 7,480,889 B2 | 1/2009 | Abrams et al. | |
| 7,512,927 B2 | 3/2009 | Gallatin et al. | |
| 7,571,423 B2 | 8/2009 | Abrams et al. | |
| 2002/0028393 A1 * | 3/2002 | Laidig et al. | 430/5 |
| 2002/0066069 A1 | 5/2002 | Ashida et al. | |
| 2002/0177050 A1 | 11/2002 | Tanaka | |
| 2002/0188924 A1 * | 12/2002 | Pierrat et al. | 716/19 |
| 2003/0095267 A1 * | 5/2003 | Mieher et al. | 356/614 |
| 2003/0103189 A1 | 6/2003 | Neureuther et al. | |
| 2003/0106642 A1 | 6/2003 | Fairbairn | |
| 2003/0123707 A1 | 7/2003 | Park | |
| 2003/0140330 A1 | 7/2003 | Tanaka et al. | |
| 2003/0152841 A1 | 8/2003 | Averbukh | |
| 2003/0165749 A1 | 9/2003 | Fritze et al. | |
| 2003/0198872 A1 | 10/2003 | Yamazoe et al. | |
| 2004/0008880 A1 | 1/2004 | Horie et al. | |
| 2004/0021660 A1 | 2/2004 | Ng-Thow-Hing et al. | |
| 2004/0031013 A1 * | 2/2004 | Dulman et al. | 716/19 |
| 2004/0073884 A1 | 4/2004 | Kroyan | |
| 2004/0086792 A1 | 5/2004 | Romeo et al. | |
| 2004/0101766 A1 | 5/2004 | Mesuda et al. | |
| 2004/0136587 A1 | 7/2004 | Kalus et al. | |
| 2004/0147121 A1 | 7/2004 | Nakagaki et al. | |
| 2004/0161678 A1 | 8/2004 | Misaka | |
| 2004/0166422 A1 | 8/2004 | Yamazoe et al. | |
| 2004/0214096 A1 | 10/2004 | Dulman et al. | |
| 2004/0229133 A1 | 11/2004 | Socha et al. | |
| 2004/0265707 A1 | 12/2004 | Socha | |
| 2005/0066300 A1 | 3/2005 | Zach | |
| 2005/0122500 A1 | 6/2005 | Ye et al. | |
| 2005/0136340 A1 | 6/2005 | Baselmans et al. | |
| 2005/0142470 A1 | 6/2005 | Socha et al. | |
| 2005/0147893 A1 | 7/2005 | Ogawa et al. | |
| 2005/0191566 A1 | 9/2005 | Liu et al. | |
| 2005/0251771 A1 | 11/2005 | Robles | |
| 2005/0265605 A1 | 12/2005 | Nakamoto et al. | |
| 2006/0049978 A1 | 3/2006 | Siegel | |
| 2006/0051682 A1 | 3/2006 | Hess et al. | |
| 2006/0172204 A1 | 8/2006 | Peng et al. | |
| 2006/0273242 A1 | 12/2006 | Hunsche et al. | |
| 2007/0009808 A1 | 1/2007 | Abrams et al. | |
| 2007/0011644 A1 | 1/2007 | Abrams et al. | |
| 2007/0011645 A1 | 1/2007 | Abrams et al. | |
| 2007/0011647 A1 | 1/2007 | Abrams et al. | |
| 2007/0011648 A1 | 1/2007 | Abrams et al. | |
| 2007/0026613 A1 | 2/2007 | Ryu et al. | |
| 2007/0133862 A1 | 6/2007 | Gold et al. | |
| 2007/0136716 A1 | 6/2007 | Abrams et al. | |
| 2007/0156327 A1 | 7/2007 | Tipping et al. | |
| 2007/0184357 A1 | 8/2007 | Abrams et al. | |
| 2007/0184369 A1 | 8/2007 | Abrams et al. | |
| 2007/0186206 A1 | 8/2007 | Abrams et al. | |
| 2007/0186208 A1 | 8/2007 | Abrams et al. | |
| 2007/0192756 A1 | 8/2007 | Abrams et al. | |
| 2007/0198966 A1 | 8/2007 | Abrams et al. | |
| 2007/0217566 A1 | 9/2007 | Chen et al. | |
| 2009/0013304 A1 | 1/2009 | Peng | |
| 2009/0073413 A1 | 3/2009 | Abrams et al. | |
| 2009/0077526 A1 | 3/2009 | Abrams et al. | |
| 2009/0077527 A1 | 3/2009 | Gergov et al. | |

FOREIGN PATENT DOCUMENTS

| | | |
|---|---|---|
| WO | WO 2006/ 078791 A3 | 7/2006 |
| WO | WO 2007/ 033362 A2 | 3/2007 |
| WO | WO 2007/ 033362 A3 | 3/2007 |
| WO | WO 2007/ 041600 A3 | 4/2007 |
| WO | WO 2007/ 041602 A2 | 4/2007 |
| WO | WO 2007/ 041602 A3 | 4/2007 |
| WO | WO 2007/ 041701 A2 | 4/2007 |
| WO | WO 2007/ 041701 A3 | 4/2007 |
| WO | WO 2007/ 044557 A2 | 4/2007 |
| WO | WO 2007/ 044557 A3 | 4/2007 |
| WO | WO 2007/ 044630 A2 | 4/2007 |
| WO | WO 2007/ 044630 A3 | 4/2007 |
| WO | WO 2007/ 044827 A2 | 4/2007 |
| WO | WO 2007 /044827 A3 | 4/2007 |
| WO | WO 2008/ 039674 A2 | 4/2008 |
| WO | WO 2008/ 039674 A3 | 4/2008 |
| WO | WO 2009/036364 A1 | 3/2009 |

OTHER PUBLICATIONS

Nicolas Bailey Cobb, PhD Thesis, "Fast Optical and Process Proximity Correction Algorithms for Integrated Circuit Manufacturing", U.C. Berkeley, Spring 1998.

B.E.A. Saleh and S.I. Sayegh, "Reductions of errors of microphotographic reproductions by optical corrections of original masks", Optical Eng. vol. 20, No. 5 pp. 781-784 (1981).

K.M. Nashold and B.E.A. Saleh, "Image construction through diffraction-limited high-contrast imaging systems: an iterative approach", J. Opt. Soc. Am.A, vol. 2, No. 5 pp. 635-643 (1985).

Y. Liu and A. Zakhor, "Optimal binary image design for optical lithography", Proc. SPIE vol. 1264 pp. 401-412 (1990).

Y. Liu and A. Zakhor, "Binary and phase-shifting image design for optical lithography", Proc. SPIE vol. 1463 pp. 382-399 (1991).

A. Rosenbluth et. al, "Optimum mask and source patterns to print a given shape", JM$^3$ vol. 1 No. 1 pp. 13-30 (2002).

Y-T Wang, Y.C. Pati, H. Watanabe and T. Kailath, "Automated design of halftoned double-exposure phase-shifting masks", Proc. SPIE vol. 2440 pp. 290-301 (1995).

Y.H. Oh, and J-C Lee, "Resolution enhancement through optical proximity correction and stepper parameter optimization for 0.12-um mask pattern", Proc. SPIE vol. 3679 pp. 607-613 (1999).

J.A. Sethian and D. Adalsteinsson, "An overview of level set methods for etching, deposition, and lithography development", IEEE Trans. on Semiconductor Manufacturing, vol. 10, No. 1, pp. 167-184, Feb. 1997.

J.M. Berg and N. Zhou, "Shape-based optimization of a plasma etching process", $39^{th}$ IEEE Conf. on Decision and Control, pp. 2023-2028 (Dec. 2000).

J.M. Geremia and H. Rabitz, "Optimal Hamiltonian identification: the synthesis of quantum optimal control and quantum inversion", J. Chem. Physics, vol. 118, No. 12 pp. 5369-5382 (Mar. 2003).

Erdmann et al., Enhancements in Rigorous Simulation of Light Diffraction from Phase Shaft Masks, Mar. 2002, SPIE, vol. 4691, pp. 1156-1167.

Gordon et al., Lithography simulation employing rigorous solution of Maxwell's equations, Feb. 1998, SPIE, vol. 3334, pp. 176196.

Wong et al., Massively Parallel Electromagnetic Simulation for Photolithographic Applications, Oct. 1995, IEEE, vol. 14, pp. 1231-1240.

Sethian, J.A., "Level set methods and fast marching methods," 1999, Cambridge University Press, pp. 316-360 (printed from website http://math.berkeley.edu/~sethian/level_set.html).

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

J.A. Sethian and D. Adalsteinsson, "An overview of level set methods for etching, deposition, and lithography development", IEEE Trans. on Semiconductor Manufacturing, vol. 10, No. 1, pp. 1-30, Jan. 8, 1996.

Abrams, Daniel et al., "Technique for Determining a Mask Pattern Corresponding to a Photomask," Nonfinal Office Action mailed May 28, 2009, in U.S. Appl. No. 11/674,130, filed Feb. 12, 2007.

Abrams, Daniel et al., "Method for Time-Evolving Rectilinear Contours Representing Photo Masks," Response to Restriction Requirement filed Jun. 15, 2009, in U.S. Appl. No. 11/674,133, filed Feb. 12, 2007.

Abrams, Daniel et al., "Lithography Verification Using Guard Bands," Nonfinal Office Action mailed Oct. 27, 2008, in U.S. Appl. No. 11/538,290, filed Oct. 3, 2006.

Abrams, Daniel et al., "Lithography Verification Using Guard Bands," Final Office Action mailed Jul. 7, 2009, in U.S. Appl. No. 11/538,290, filed Oct. 3, 2006.

Abrams, Daniel et al., "Lithography Verification Using Guard Bands," Response to Office Action filed Apr. 14, 2009, in U.S. Appl. No. 11/538,290, filed Oct. 3, 2006.

Abrams, Daniel et al., "Lithography Verification Using Guard Bands," Response to Office Action Nov. 9, 2009, in U.S. Appl. No. 11/538,290, filed Oct. 3, 2006.

Abrams, Daniel et al., "Mask-Pattern Determination using Topology Types," Nonfinal Office Action mailed Sep. 8, 2009, in U.S. Appl. No. 11/538,420, filed Oct. 3, 2006.

Peng, Danping et al., "Systems, Masks and Methods for Printing Contact Holes and Other Patterns," Nonfinal Office Action mailed Aug. 13, 2008, in U.S. Appl. No. 11/335,018, filed Jan. 18, 2006.

Abrams, Daniel et al., "Systems, Masks, and Methods for Manufacturable Masks," Nonfinal Office Action mailed Apr. 2, 2009, in U.S. Appl. No. 11/245,691, filed Oct. 6, 2005.

Abrams, Daniel et al., "Systems, Masks, and Methods for Manufacturable Masks," Response to Office Action filed Jul. 29, 2009, in U.S. Appl. No. 11/245,691, filed Oct. 6, 2005.

Abrams, Daniel et al., "Systems, Masks, and Methods for Photomasks Optimized with Approximate and Accurate Merit Functions," Nonfinal Office Action mailed May 11, 2009, in U.S. Appl. No. 11/539,601, filed Oct. 6, 2005.

Abrams, Daniel et al., "Systems, Masks, and Methods for Photomasks Optimized with Approximate and Accurate Merit Functions," Response to Office Action filed Nov. 9, 2009, in U.S. Appl. No. 11/539,601, filed Oct. 6, 2005.

Abrams, Daniel et al., "Fast Systems and Methods for Calculating Electromagnetic Fields Near Photomasks," Nonfinal Office Action mailed Feb. 13, 2007, in U.S. Appl. No. 11/245,714, filed Oct. 6, 2005, now abandoned.

Abrams, Daniel S., et al., "Systems, Masks, and Methods for Photolithography," Nonfinal Office Action mailed Mar. 19, 2009, in U.S. Appl. No. 11/531,673, filed Sep. 13, 2005.

Abrams, Daniel et al., "Technique for Determining a Mask Pattern Corresponding to a Photomask," Response to Nonfinal Office Action filed Aug. 27, 2009, in U.S. Appl. No. 11/674,130, filed Feb. 12, 2007.

Abrams, Daniel S., et al., "Systems, Masks, and Methods for Photolithography," Response to Nonfinal Office Action filed Aug. 13, 2009, in U.S. Appl. No. 11/531,673, filed Sep. 13, 2005.

Abrams, Daniel S., et al., "Systems, Masks, and Methods for Photolithography," Notice of Allowance mailed Oct. 2, 2009, in U.S. Appl. No. 11/531,673, filed Sep. 13, 2005.

Abrams, Daniel et al., "Method for Time-Evolving Rectilinear Contours Representing Photo Masks," Notice of Allowance mailed Sep. 22, 2009, 2009, in U.S. Appl. No. 11/674,133, filed Feb. 12, 2007.

Abrams, Daniel et al., "Method for Time-Evolving Rectilinear Contours Representing Photo Masks," Restriction Requirement mailed Jan. 14, 2009, in U.S. Appl. No. 11/674,133, filed Feb. 12, 2007.

Abrams, Daniel et al., "Technique for Determining a Mask Pattern Corresponding to a Photomask," Notice of Allowance mailed Dec. 14, 2009, in U.S. Appl. No. 11/674,130, filed Feb. 12, 2007.

Abrams, Daniel et al., "Method for Time-Evolving Rectilinear Contours Representing Photo Masks," Office Action mailed Nov. 23, 2009, in U.S. Appl. No. 11/674,133, filed Feb. 12, 2007.

Abrams, Daniel S., et al., "Systems, Masks, and Methods for Photolithography," Notice of Allowance mailed Dec. 1, 2009, in U.S. Appl. No. 11/531,673, filed Sep. 13, 2005.

Abrams, Daniel et al., "Lithography Verification Using Guard Bands," Notice of Allowance mailed Dec. 28, 2009, in U.S. Appl. No. 11/538,290, filed Oct. 3, 2006.

Abrams, Daniel et al., "Systems, Masks, and Methods for Manufacturable Masks," Notice of Allowance mailed Nov. 30, 2009, in U.S. Appl. No. 11/245,691, filed Oct. 6, 2005.

Abrams, Daniel et al., "Mask-Pattern Determination using Topology Types," Response to Nonfinal Office Action mailed Jan. 7, 2010, in U.S. Appl. No. 11/538,420, filed Oct. 3, 2006.

Abrams, Daniel et al., "Method for Time-Evolving Rectilinear Contours Representing Photo Masks," Response to Nonfinal Office Action filed Jan. 7, 2010, in U.S. Appl. No. 11/674,133, filed Feb. 12, 2007.

Abrams, Daniel et al., "Systems, Masks, and Methods for Photomasks Optimized with Approximate and Accurance Merit Functions," Notice of Allowance mailed Jan. 11, 2010, in U.S. Appl. No. 11/539,601, filed Oct. 6, 2005.

* cited by examiner

```
                                                              ┌─ 500
┌─────────────────────────────────────────────────────────┐
│   PROVIDE A TARGET PATTERN THAT INCLUDES AT LEAST ONE   │
│                    CONTINUOUS FEATURE                   │
│                           510                           │
└─────────────────────────────────────────────────────────┘
                              │
                              ▼
┌─────────────────────────────────────────────────────────┐
│  DETERMINE A MASK PATTERN THAT INCLUDES AT LEAST TWO    │
│  SEPARATE FEATURES CORRESPONDING TO AT LEAST THE ONE    │
│  CONTINUOUS FEATURE, WHERE AT LEAST THE TWO SEPARATE    │
│  FEATURES ARE SEPARATED BY A SPACING HAVING A LENGTH,   │
│  AND WHERE THE SPACING OVERLAPS AT LEAST A PORTION OF   │
│            AT LEAST THE ONE CONTINUOUS FEATURE          │
│                           512                           │
└─────────────────────────────────────────────────────────┘
```

FIG. 5

┌─────────────────────────────────────────────────────────┐
│  PROVIDE A TARGET PATTERN THAT INCLUDES AT LEAST ONE    │
│                   CONTINUOUS FEATURE                    │
│                          610                            │
└─────────────────────────────────────────────────────────┘
                             │
                             ▼
┌─────────────────────────────────────────────────────────┐
│  PROVIDE A WRITE PATTERN THAT INCLUDES INSTRUCTIONS FOR │
│   AT LEAST TWO SEPARATE FEATURES CORRESPONDING TO AT    │
│   LEAST THE ONE CONTINUOUS FEATURE, WHERE AT LEAST THE  │
│    TWO SEPARATE FEATURES ARE SEPARATED BY A SPACING     │
│    HAVING A LENGTH, AND WHERE THE SPACING OVERLAPS AT   │
│  LEAST A PORTION OF AT LEAST THE ONE CONTINUOUS FEATURE │
│                          612                            │
└─────────────────────────────────────────────────────────┘

MASK-PATTERNS INCLUDING INTENTIONAL BREAKS

CROSS-REFERENCE

This application claims the benefit of U.S. Provisional Application No. 60/723,843, filed Oct. 4, 2005, which is incorporated herein by reference in its entirety.

BACKGROUND OF THE INVENTION

1. Field of the Invention

The present invention relates to techniques for determining mask patterns for lithographic processes that use photomasks and write patterns for semiconductor-manufacturing processes that use write devices.

2. Related Art

Lithography processing represents an essential technology for manufacturing Integrated Circuits (IC) and Micro Electro-Mechanical Systems (MEMS). Lithographic techniques are used to define patterns, geometries, features or shapes (henceforth referred to as 'patterns') onto an integrated circuit die or semiconductor wafer or chips where the patterns are typically defined by a set of contours, lines, boundaries, edges, or curves (henceforth referred to as 'contours'), which generally surround, enclose, and/or define the boundary of the various regions which constitute a pattern.

Demand for increased density of features on dies and wafers has resulted in the design of circuits with decreasing minimum dimensions. However, due to the wave nature of light, as dimensions approach sizes comparable to the wavelength of the light used in the photolithography process, the resulting wafer patterns deviate from the corresponding photo-mask patterns and are accompanied by unwanted distortions and artifacts.

Techniques such as Optical Proximity Correction (OPC) attempt to improve resolution and/or a process window in a photolithography process by appropriately pre-distorting the photo-mask pattern such that the wafer pattern is printed more accurately. In addition, other techniques known as resolution enhancement technologies (RET) also modify the design of the photo-mask in order to improve photolithography. However, even with these various approaches, as the density of features has increased, it has become increasingly difficult to determine suitable mask patterns that correspond to photo-mask patterns which print acceptable wafer patterns. In addition, similar challenges occur in mask-less semiconductor processes, such as those that use a write device to print a wafer pattern based on a write pattern Hence what is needed are improved systems and methods to facilitate determination of mask patterns and/or write patterns.

SUMMARY

One embodiment of the present invention provides a method for determining a mask pattern to be used on a photo-mask in a photolithographic process, where the mask pattern has a plurality of distinct types of regions having distinct optical properties. During the method, a target pattern that includes at least one continuous feature is provided. Then a mask pattern that includes a plurality of distinct types of regions corresponding to the distinct types of regions of the photo-mask is determined. Note that the mask pattern includes at least two separate features corresponding to at least the one continuous feature. Furthermore, at least the two separate features are separated by a spacing having a length and the spacing overlaps at least a portion of at least the one continuous feature.

In some embodiments, at least the two separate features are associated with an intersection in at least the one continuous feature. Furthermore, at least the two separate features may at least partially overlap at least the one continuous feature and/or may be separated by a topological change in the mask pattern. For example, at least the one continuous feature may include a line, an intersection of two or more lines, or a contact. Note that the length may be a function of a width of at least at portion of the one continuous feature.

In some embodiments, the determining includes performing optical proximity correction. In some embodiments, the determining may include calculating a gradient of a function. This function may depend on an initial mask pattern and the estimate of a wafer pattern to be printed using the photo-mask in the photo-lithographic process. Note that the gradient may be calculated based on a formula obtained by taking a derivative of the function. Furthermore, the estimated wafer pattern may be determined using a model of the photo-lithographic process, which may include a photo-resist model.

In some embodiments, the target pattern corresponds to at least a portion of an integrated circuit.

In some embodiments, at least one or at least the two separate features includes one or more partial indentations. Note that a respective partial indentation of the one or more partial indentations may have a pre-determined width. Furthermore, in some embodiments at least one of at least the two separate features includes one or more bumps. Note that a respective bump of the one or more bumps may have a pre-determined width.

In some embodiments, the target pattern and the mask pattern include bitmap images and/or grayscale images. Furthermore, in some embodiments the determining is performed at sub-pixel resolution. And in some embodiments, the determining is performed over a range of process conditions in the photo-lithographic process.

Another embodiment provides a computer system configured to execute instructions corresponding to at least some of the above-described operations.

Another embodiment provides a computer-program product for use in conjunction with the computer system.

Another embodiment provides a photo-mask for use in the photolithographic process. This photo-mask has a plurality of distinct types of regions having distinct optical properties, and a mask pattern to which the photo-mask corresponds is determined using the above-determined method for determining a mask pattern.

Another embodiment provides a semiconductor wafer. This semiconductor wafer is produced in the photo-lithographic process that includes the photo-mask.

Another embodiment provides a data file stored in a computer-readable medium that includes information corresponding to the mask pattern.

Another embodiment provides a method for determining a write pattern to be used by a write device in a semiconductor-manufacturing process. During the method, a target pattern that includes at least one continuous feature is provided. Then, a write pattern is determined. This write pattern includes instructions for at least two separate features corresponding to at least the one continuous feature. Note that at least the two separate features are separated by a spacing having a length and the spacing overlaps at least a portion of at least the one continuous feature.

Another embodiment provides a semiconductor wafer. This semiconductor wafer is produced in the semiconductor-manufacturing process that includes the write device that uses the write pattern determined in the above-described method.

Another embodiment provides a data file stored in a computer-readable medium that includes information corresponding to the write pattern.

INCORPORATION BY REFERENCE

All publications and patent applications mentioned in this specification are herein incorporated by reference to the same extent as if each individual publication or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software), and data structures or files for use with the computer system are described. These systems, processes, and data structures may be used to determine mask patterns that, in turn, may be used when producing photo-masks. The photo-masks may be used in (photo-) lithographic processes to produce semiconductor wafers that have associated printed wafer patterns. Alternatively, the systems, processes, and data structures may be used to determine write patterns. These write patterns may be used by write devices in mask-less semiconductor manufacturing processes to produce semiconductor wafers.

In particular, the mask pattern and/or the write pattern may be determined in accordance with an estimated wafer pattern that may be produced using a photo-mask corresponding to the mask pattern. The target pattern may include at least one continuous feature. However, the mask pattern and/or the write pattern may include at least two separate features (or instructions for at least two separate features) that correspond to at least the one continuous feature, i.e., the wafer patterns that are printed may have at least one continuous printed feature that is an acceptable approximation (within certain tolerances) of at least the one continuous feature. These two separate features may be separated by a spacing (sometimes referred to as a 'break') having a length and the spacing overlaps at least a portion of at least the one continuous feature.

In some embodiments, at least the two separate features are associated with an intersection in at least the one continuous feature. Furthermore, at least the two separate features may at least partially overlap at least the one continuous feature and/or may be separated by a topological change in the mask pattern. For example, at least the one continuous feature may include a line, an intersection of two or more lines, or a contact. Note that the length may be a function of a width of at least at portion of the one continuous feature.

Such a mask pattern or write pattern that includes an intentional break with these characteristics may be counterintuitive. However, as the density of features that are to be printed increases, non-local optical interactions are increasingly common. These effects blur the separate features such that the resulting printed feature is continuous (as desired in the target pattern). At least a portion of these separate features and/or at least a portion the spacing between them overlap the continuous feature.

For example, in one embodiment, the continuous feature in the target pattern includes a substantially rectangular region. In this example, the separate features on the mask pattern or write pattern may include a first separate feature that substantially or completely overlaps a first segment of the rectangular region and a second separate feature that substantially or completely overlaps a second segment of the rectangular region. There is a space between the first separate feature and the second separate feature that substantially or completely overlaps a portion of the rectangular region of the target pattern between the first segment and the second segment. The mask pattern or write pattern is then used to print a feature that approximates the continuous feature, including printing a portion of the rectangular feature in the region corresponding to the space between the first separate feature and the second separate feature.

In another example embodiment, the continuous feature in the target pattern includes two connected regions that are substantially rectangular region, with one rectangular region extending substantially orthogonally from the other rectangular region. For example, in this embodiment, the continuous feature may be a "T" or "L" shaped region where two line segments intersect. In other embodiments, the rectangular regions may intersect at an angle instead of being substantially orthogonal. In this example, the separate features on the mask pattern or write pattern may include first and second separate features that substantially or completely overlap the first and second rectangular regions, respectively, except for a space corresponding to a region where the first and second rectangular regions intersect (e.g., at the junction of the "T" or "L" intersection). The space substantially or completely overlaps a portion of the first and second rectangular regions adjacent to the intersection of these regions. The mask pattern or write pattern is then used to print a feature that approximates the continuous feature, including printing a portion of the continuous feature (e.g., the region of intersection) in the region corresponding to the space between the first separate feature and the second separate feature.

The mask pattern and/or the write pattern may be determined using an iterative calculation. This calculation may be based on a difference between an estimated wafer pattern and the target pattern. This estimate of the wafer pattern may result from the photolithographic process that uses at least a portion of the mask pattern or the semiconductor-manufacturing process that uses at least a portion of the write pattern. Furthermore, one or more mask patterns and/or the target pattern may be represented by pixilated images. For example, in some embodiments the target pattern and the mask pattern may be represented by bitmap images and/or grayscale images. Furthermore, in some embodiments the determining is performed at sub-pixel resolution. And in some embodiments, the determining is performed over a range of process conditions in the photo-lithographic process and/or the semiconductor-manufacturing process.

Figure 1A:
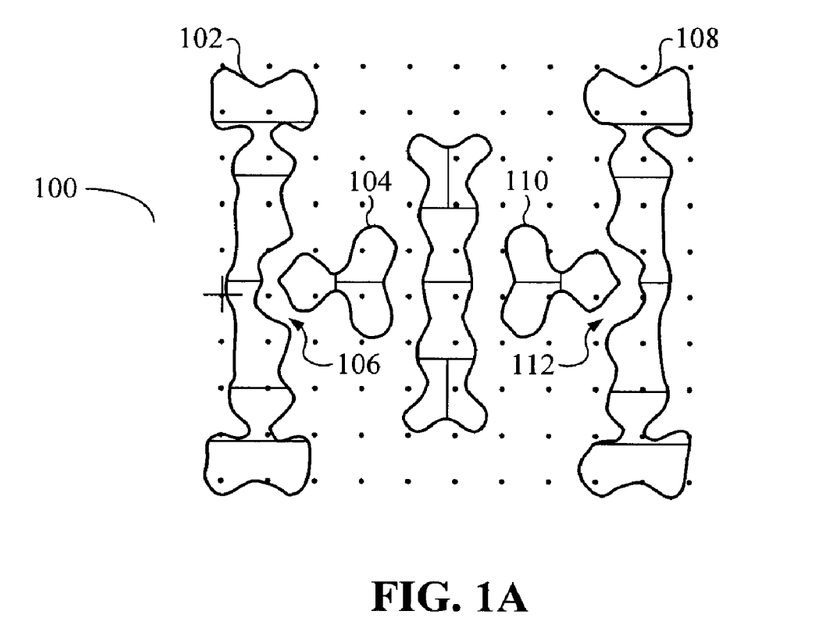
FIG. 1A illustrates a pattern that includes intentional breaks in accordance with an embodiment of the present invention.
Figure 1B:
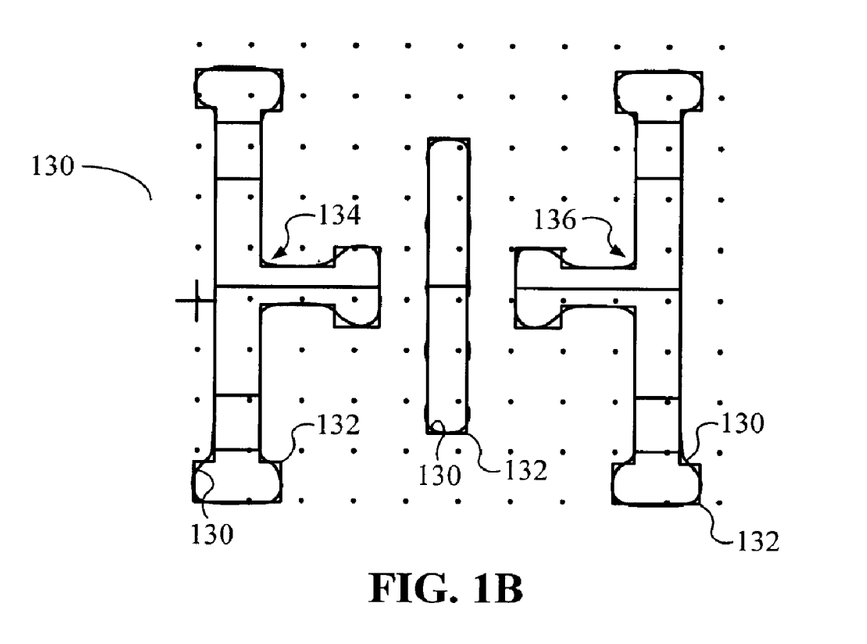
FIG. 1B illustrates a printed wafer pattern in accordance with an embodiment of the present invention.

FIG. 1A shows an example mask pattern 100 according to an example embodiment. The mask pattern includes separate features 102 and 104 separated by a gap 106. The mask pattern also includes separate features 108 and 110 separated by a gap 112. This mask pattern is used to print the wafer pattern 130 shown in FIG. 1B. The wafer pattern closely approximates the target pattern 132 (over which it is superimposed in FIG. 1B), although it is slightly curved at the corners while the target pattern has sharper corners. As shown in FIG. 1B, the wafer pattern is printed at locations 134 and 136 corresponding to the locations where the mask pattern had a gap 106 and 112. The example of FIGS. 1A and 1B is based on the following lithography conditions: minimum feature size: 80 nm; minimum spacing 100 nm; mask: Clear field, ATT PSM; illumination: 193 nm; numerical aperture (NA): 0.85 and annular: 0.5:0.85.

Some of the aspects of this example embodiment shall now be described. One aspect is that a continuous T shaped feature in the target pattern is replaced with two separate features in the mask pattern. Similar behavior may also be seen in continuous features with angled rather than perpendicular lines, as well as L shaped patterns rather than T shaped patterns. Another aspect of the embodiment shown is that there is an indentation in the vertical line of the mask pattern corresponding to the location of the horizontal line. In other embodiments there may be no indentation, or there may be an outward bump rather than an indentation. In the embodiment shown, the gap between is comparable to, but smaller than, the line width. In other embodiments, the gap may be the same size, more than 50% larger, more than 100% larger, less than ⅔ the line width, less than ½ the line width, or barely present. The mask pattern, target pattern, wafer pattern and lithography conditions described in connection with FIGS. 1A and 1B are examples only and other embodiments may use other patterns and conditions.

Figure 2A:
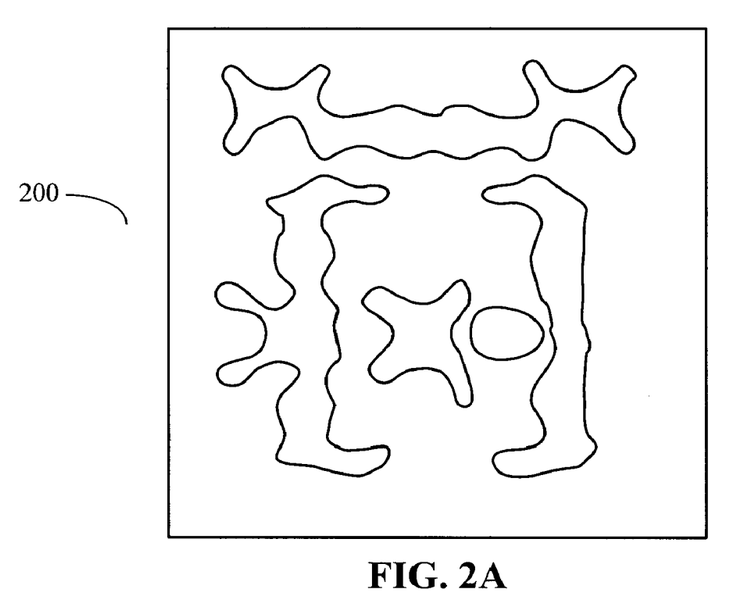
FIG. 2A illustrates a pattern that includes intentional breaks in accordance with an embodiment of the present invention.
Figure 2B:
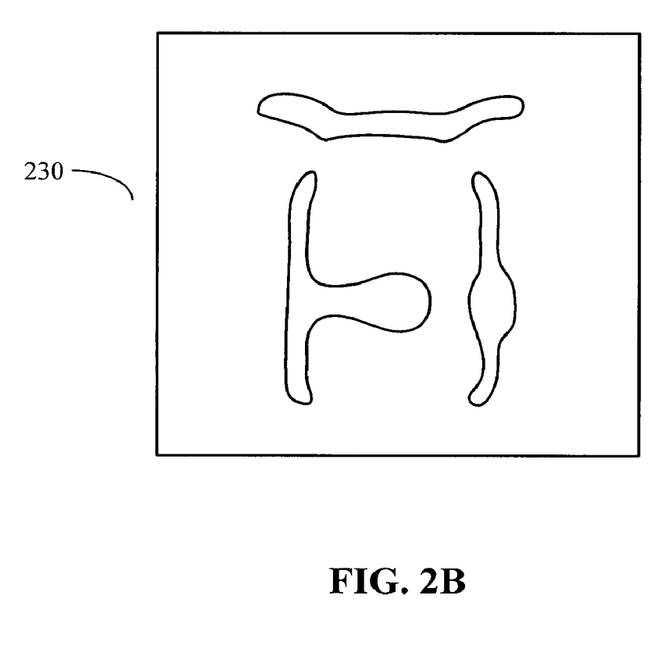
FIG. 2B illustrates a printed wafer pattern in accordance with an embodiment of the present invention.
Figure 3A:
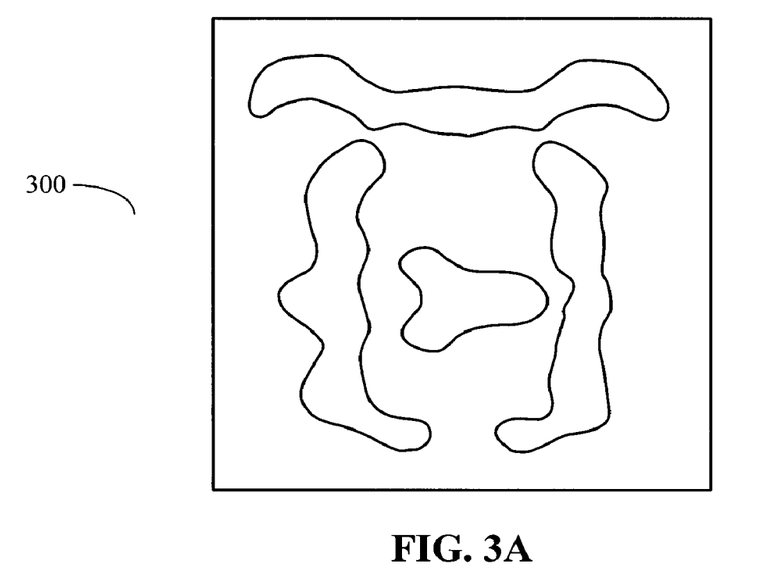
FIG. 3A illustrates a pattern that includes intentional breaks in accordance with an embodiment of the present invention.
Figure 3B:
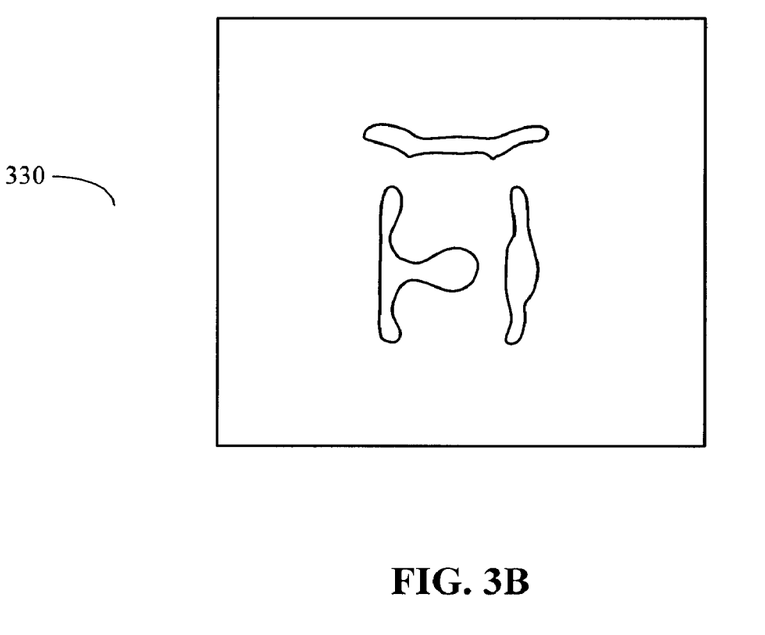
FIG. 3B illustrates a printed wafer pattern in accordance with an embodiment of the present invention.

FIGS. 2A and 3A show additional mask patterns 200 and 300 in accordance with example embodiments. The mask patterns 200 and 300 shown in FIGS. 2A and 3A print wafer patterns 230 and 330 as shown in FIGS. 2B and 3B, respectively. These mask patterns are intended to be used for 90 nm and 65 nm patterns, respectively. In one example, these mask patterns are intended to print a layer from an SRAM cell. As shown in FIGS. 2A and 3A, the vertical feature on the right of each of these mask patterns and the feature(s) in the middle of each of these mask patterns are separated by a gap. However, as shown in FIGS. 2B and 3B, the wafer pattern is printed in the region corresponding to these gaps. Note that, due to the views illustrated in this example, the right side of the mask patterns shown in FIGS. 2A and 3A correspond to the left side of the wafer pattern shown in FIGS. 2B and 3B. The vertical feature on the left of the wafer pattern forms a continuous pattern with the feature in the middle of the wafer pattern.

In the example of FIG. 2A, the T pattern is broken into three pieces: a vertical line, a middle region, and an end region. The end region in this example is larger than the middle region because the end of the T pattern is wider than the connecting piece. In other embodiments, the relative sizes may be different, with the end larger or smaller than the middle. In the embodiment shown in FIG. 2A, the end region forms an X-type pattern, which is similar to a pattern which might be used to print an isolated contact. As in the previous example embodiment, there is a slight indentation in the vertical portion of the T corresponding to the location of the horizontal portion. In this example the indentation is more subtle and the gap is narrower, perhaps ¼ the linewidth.

In the example embodiment shown in FIG. 3A, the pattern is broken into two pieces. The gap between the pieces is roughly ½ the line width. There is a clear indentation in the vertical portion of the T corresponding to the location of the horizontal portion. In the embodiment shown in FIG. 3A, the gap between is comparable to, but smaller than, the line width. In other embodiments, the gap may be the same size, more than 50% larger, more than 100% larger, less than ⅔ the line width, less than ½ the line width, or barely present.

The horizontal portion generally gets wider as it gets further from the vertical portion. In other embodiments it may stay roughly the same width or get narrower.

In the example of FIG. 2A, the indentation is about ¼ the linewidth. In the example of FIG. 3A, the indentation is about linewidth. These are examples only. In other embodiments, the indentation could be less than ¼, between ¼ and ½, or between ½ and ¾ the linewidth. In some embodiments, there may be a corresponding bump on the opposite side of the T. The size of the bump in various embodiments would include all of those listed for the indentation, and may be different than the indentation. In other embodiments, there may be bumps on both sides, or indentations on both sides, all of possible combinations of sizes.

The above mask patterns, wafer patterns, target patterns, lithography conditions, indentation sizes and bump sizes are examples only and other embodiments may use other patterns, conditions and sizes.

We now describe embodiments of a computer system, a method, software, and data structures for determining mask patterns and/or write patterns.

In an example embodiment, the mask pattern or write pattern is determined using an inverse calculation based on a model of a photolithography process. In some embodiments, this model may include a photo-resist model or an etch model. In an example embodiment, the estimated pattern is determined using either a forward-optical model, in which a photo-mask or write beam (corresponding to the mask pattern or write patter) at an object plane of an optical system is used to determine the printed wafer pattern at an image plane.

The semiconductor-manufacturing process may use a laser-writer or direct-write device. In these embodiments, the mask pattern (corresponding to the photo-mask) described above is not written on a photomask. Instead, there is a write pattern that is to guide the writing of the direct-write device in order to print the target pattern on a wafer. Note that the lithographic process and/or the semiconductor-manufacturing process may include multiple exposures.

Figure 4:
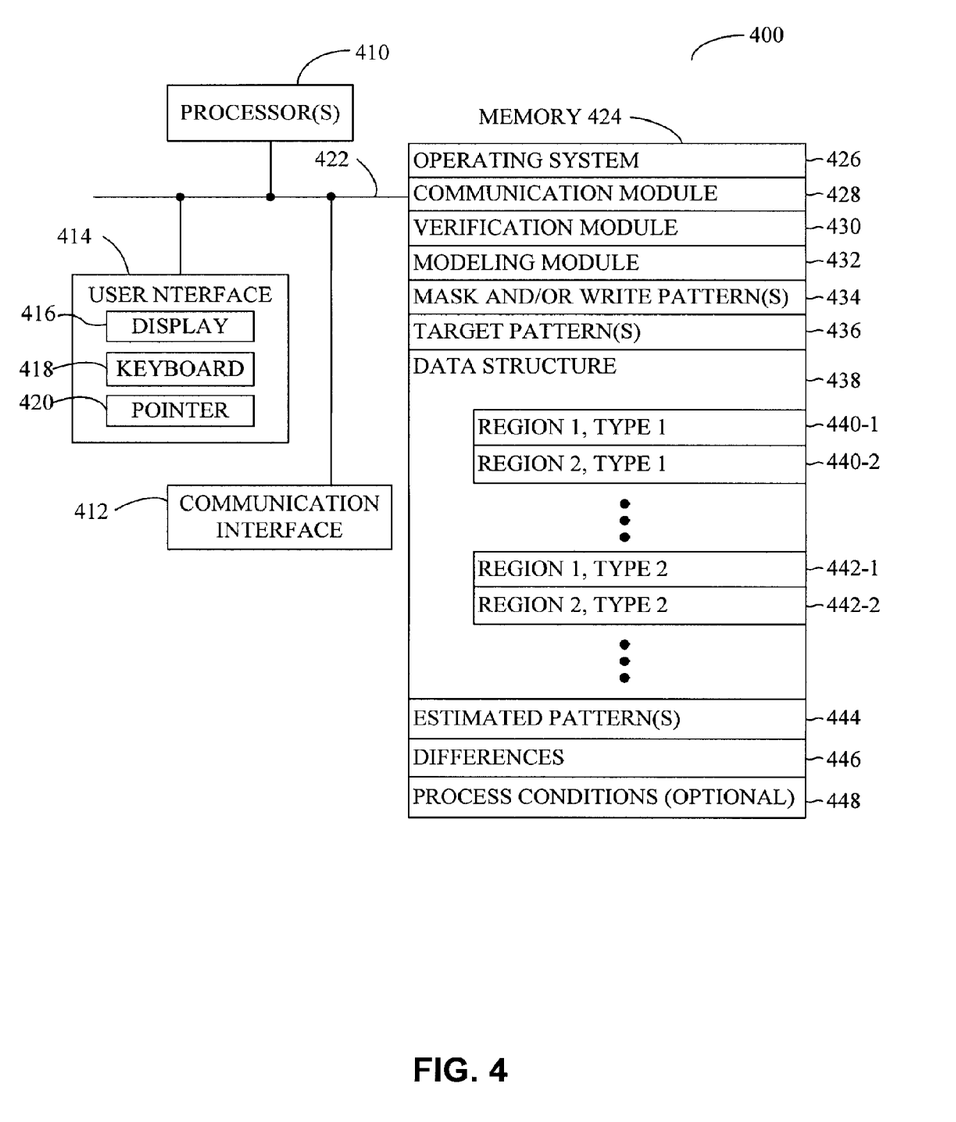
FIG. 4 is a block diagram illustrating a computer system in accordance with an embodiment of the present invention.

FIG. 4 provides a block diagram illustrating a computer system 400 in accordance with an embodiment of the present invention. The computer system 400 includes one or more processors 410, a communication interface 412, a user interface 414, and one or more signal lines 422 coupling these components together. Note that the one or more processing units 410 may support parallel processing and/or multi-threaded operation, the communication interface 412 may have a persistent communication connection, and the one or more signal lines 422 may constitute a communication bus. Moreover, the user interface 414 may include a display 416, a keyboard 418, and/or a pointer 420, such as a mouse.

Memory 424 in the computer system 400 may include volatile memory and/or non-volatile memory. More specifically, memory 424 may include ROM, RAM, EPROM, EEPROM, FLASH, one or more smart cards, one or more magnetic disc storage devices, and/or one or more optical storage devices. Memory 424 may store an operating system 426 that includes procedures (or a set of instructions) for handling various basic system services for performing hardware dependent tasks. The memory 424 may also store communications procedures (or a set of instructions) in a communications module 428. The communication procedures may be used for communicating with one or more computers, devices and/or servers, including computers, devices and/or servers that are remotely located with respect to the computer system 400.

Memory 424 may also include one or more program modules (or a set of instructions), including a verification module 430 (or a set of instructions) for verifying a lithographic process and/or a semiconductor-manufacturing process. In addition, memory 424 may include a modeling module 432 (or a set of instructions) for calculating estimated wafer patterns, mask patterns, and/or write patterns. For example, the modeling module 432 may include a forward-optical model of an optical path and/or may perform an inverse lithographic calculation. Note that such optical models may include Fourier representations of the optical path.

Furthermore, memory 424 may include one or more mask and/or write patterns 434, one or more target patterns 436, one or more estimated patterns 444, one or more differences 446 between one or more estimated patterns and one or more target patterns, and/or optional process conditions (which may be used to study a process window). In addition, memory 424 may include a data structure 438 that includes information for different types of regions 440 and 442.

Instructions in the various modules in the memory 424 may be implemented in a high-level procedural language, an object-oriented programming language, and/or in an assembly or machine language. The programming language may be compiled or interpreted, i.e., configurable or configured to be executed by the one or more processing units 410.

Although the computer system 400 is illustrated as having a number of discrete components, FIG. 4 is intended to be a functional description of the various features that may be present in the computer system 400 rather than as a structural schematic of the embodiments described herein. In practice, and as recognized by those of ordinary skill in the art, the functions of the computer system 400 may be distributed over a large number of servers or computers, with various groups of the servers or computers performing particular subsets of the functions. In some embodiments, some or all of the functionality of the computer system 400 may be implemented in one or more ASICs, FPGAs, graphics processors, digital signal processors DSPs, or other type of chip.

Computer system 400 may include fewer components or additional components, two or more components may be combined into a single component, and/or a position of one or more components may be changed. In some embodiments the functionality of computer system 400 may be implemented more in hardware and less in software, or less in hardware and more in software, as is known in the art.

In an example embodiment, an inverse calculation is used in the determining of one or more mask patterns and/or one or more write patterns. The inverse calculation may be based on minimization of an error function (which is also sometimes referred to as a cost function or merit function or a Hamiltonian function). During each iteration of the calculation, the error function may be a function of the difference between an estimated pattern that results when an image of a photo-mask (corresponding to a mask pattern) or an image associated with a write pattern is projected through a lithographic device or a write device. In some embodiments the mask pattern may be represented by a level-set function, and the mask pattern is optimized by employing a gradient descent type algorithm, where the gradient is a Frechet derivative of the merit function. This is just one example of many alternative methods for finding an optimized mask pattern that are known to one skilled in the art. For example, some embodiments may use the methods described in U.S. patent application Ser. Nos. 10/408,924; 10/408,928 (issuing as U.S. Pat. No. 7,124,394); and Ser. No. 11/531,673, each of which is incorporated herein by reference in its entirety.

Figure 5:
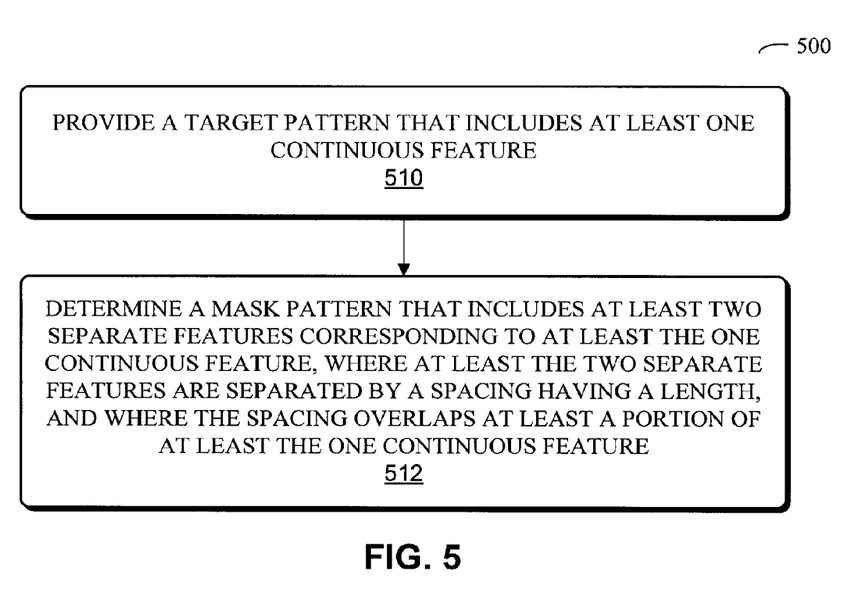
FIG. 5 is a flow chart illustrating a process for determining a mask pattern in accordance with an embodiment of the present invention.

We now discuss methods for determining mask patterns and/or write patterns. FIG. 5 provides a flow chart illustrating a process 500 for determining a mask pattern in accordance with an embodiment of the present invention. During this process, a target pattern that includes at least one continuous feature is provided (510). Then, a mask pattern is determined (512). Note that the mask pattern includes at least two separate features corresponding to at least the one continuous feature. Furthermore, at least the two separate features are separated by a spacing having a length and the spacing overlaps at least a portion of at least the one continuous feature.

Figure 6:
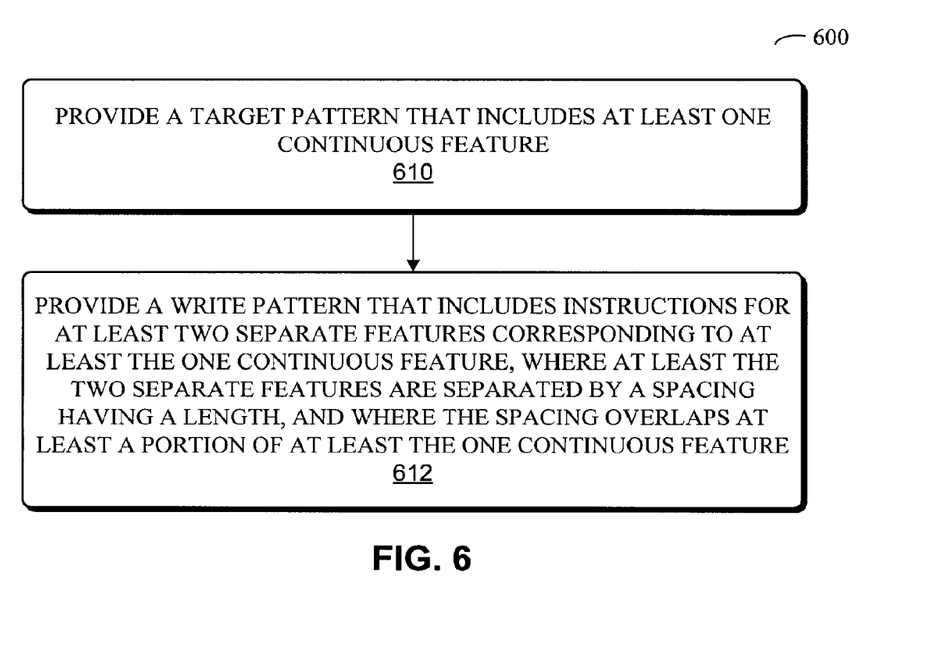
FIG. 6 is a flow chart illustrating a process for determining a write pattern in accordance with an embodiment of the present invention.

FIG. 6 provides a flow chart illustrating a process 600 for determining a write pattern in accordance with an embodiment of the present invention. During this process, a target pattern that includes at least one continuous feature is provided (610). Then, a write pattern is determined (612). Note that the write pattern includes instructions for at least two separate features corresponding to at least the one continuous feature. Furthermore, at least the two separate features are separated by a spacing having a length and the spacing overlaps at least a portion of at least the one continuous feature.

Note that in some embodiments of the process 500 and/or the process 600 there may be additional or fewer operations, the order of the operations may be changed, and two or more operations may be combined into a single operation.

Figure 7:
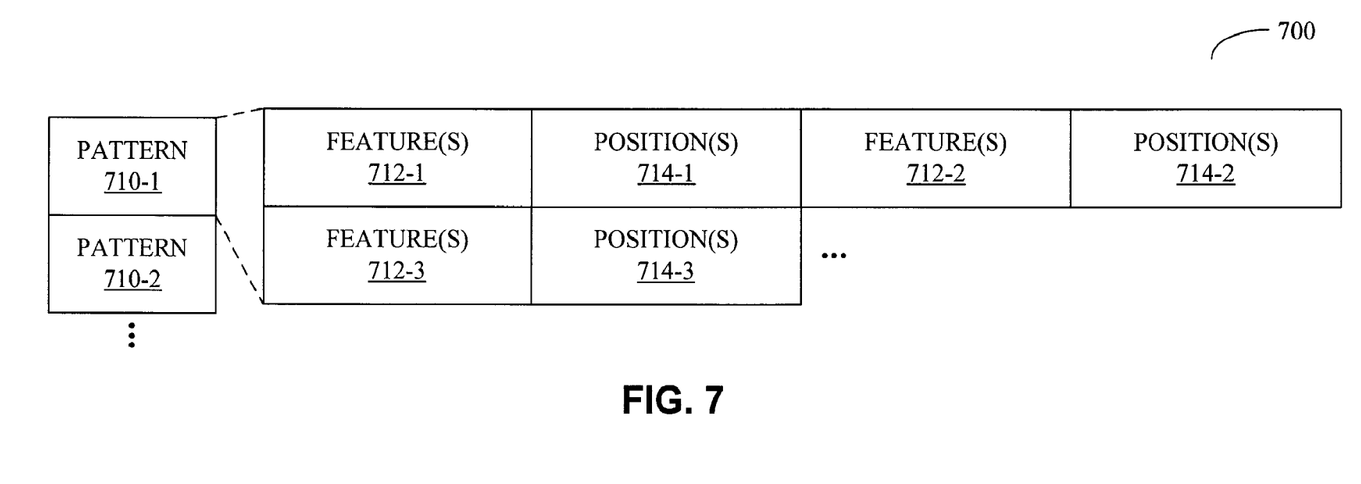
FIG. 7 is a block diagram illustrating a data structure in accordance with an embodiment of the present invention.

We now discuss data structures that may be used in the computer system 400 (FIG. 4). FIG. 7 provides a block diagram illustrating a data structure 700 in accordance with an embodiment of the present invention. This data structure may include patterns 710, such as write patterns and/or mask patterns. For example, pattern 710-1 may include one or more features 712 and corresponding positions 714. At least pairs of features 712 may correspond to a continuous feature in a target pattern. Furthermore, these features may be positioned 714 with a spacing having a length and the spacing may overlap at least a portion of at least the one continuous feature. Note that that in some embodiments of the data structure 700 there may be fewer or additional components, two or more components may be combined into a single component, and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a mask pattern to be used on a photo-mask in a photolithographic process, wherein the photo-mask has a plurality of distinct types of regions having distinct optical properties, comprising:
   providing a target pattern, wherein the target pattern includes at least one continuous feature having two portions that intersect each other, the two portions having, respectively, a first symmetry axis and a second symmetry axis; and
   determining, using at least one processor in the computer, the mask pattern that includes a plurality of distinct types of regions corresponding to the distinct types of regions of the photo-mask, wherein the mask pattern includes a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial mask pattern and the estimate of a wafer pattern to be printed using the photo-mask in the photo-lithographic process, and wherein the gradient is calculated in accordance with a formula obtained by taking a derivative of the function.

2. The computer-implemented method of claim 1, wherein the gap has a fifth symmetry axis that is approximately perpendicular to the second symmetry axis.

3. The computer-implemented method of claim 1, wherein the first symmetry axis is approximately perpendicular to the second symmetry axis.

4. The computer-implemented method of claim 1, wherein the length is a function of a width of at least at one of the portions of the one continuous feature.

5. The computer-implemented method of claim 1, wherein the first feature and the second feature are separated by a topological change in the mask pattern.

6. The computer-implemented method of claim 1, wherein the determining includes an optical proximity correction.

7. The computer-implemented method of claim 1, wherein the estimated wafer pattern is determined using a model of the photo-lithographic process.

8. The computer-implemented method of claim 7, wherein the model of the photo-lithographic process includes a photo-resist model.

9. The computer-implemented method of claim 1, wherein at least the one continuous feature includes a line, an intersection of two or more lines, or a contact.

10. The computer-implemented method of claim 1, wherein the target pattern corresponds to at least a portion of an integrated circuit.

11. The computer-implemented method of claim 1, wherein at least one of the first feature and the second feature includes one or more partial indentations, and wherein a respective partial indentation of the one or more partial indentations has a pre-determined width.

12. The computer-implemented method of claim 1, wherein at least one of the first feature and the second feature includes one or more bumps, and wherein a respective bump of the one or more bumps has a pre-determined width.

13. The computer-implemented method of claim 1, wherein the target pattern and the mask pattern include bitmap images.

14. The computer-implemented method of claim 1, wherein the target pattern and the mask pattern include grayscale images.

15. The computer-implemented method of claim 14, wherein the determining is performed at sub-pixel resolution.

16. The computer-implemented method of claim 1, wherein the determining is performed over a range of process conditions in the photo-lithographic process.

17. A computer-program product for use in conjunction with a computer system, the computer-program product comprising a computer-readable storage medium and a computer-program mechanism embedded therein for determining a mask pattern to be used on a photo-mask in a photolithographic process, wherein the photo-mask has a plurality of distinct types of regions having distinct optical properties, the computer-program mechanism including:
   instructions for providing a target pattern, wherein the target pattern includes at least one continuous feature having two portions that intersect each other, the two portions having, respectively, a first symmetry axis and a second symmetry axis; and
   instructions for determining the mask pattern that includes a plurality of distinct types of regions corresponding to the distinct types of regions of the photo-mask, wherein the mask pattern includes a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial mask pattern and the estimate of a wafer pattern to be printed using the photo-mask in the photo-lithographic process, and wherein the gradient is calculated in accordance with a formula obtained by taking a derivative of the function.

18. A computer system, comprising:
   at least one processor;
   at least one memory; and at least one program module, the program module stored in the memory and configured to be executed by the processor, wherein at least the program module is for determining a mask pattern to be used on a photo-mask in a photolithographic process, wherein the photo-mask has a plurality of distinct types of regions having distinct optical properties, at least the program module including:

instructions for providing a target pattern, wherein the target pattern includes at least one continuous feature having two portions that intersect each other, the two portions having, respectively, a first symmetry axis and a second symmetry axis; and instructions for determining the mask pattern that includes a plurality of distinct types of regions corresponding to the distinct types of regions of the photo-mask, wherein the mask pattern includes a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial mask pattern and the estimate of a wafer pattern to be printed using the photo-mask in the photo-lithographic process, and wherein the gradient is calculated in accordance with a formula obtained by taking a derivative of the function.

19. A computer system, comprising:

means for computing;

means for storing; and at least one program module mechanism, the program module mechanism stored in at least the means for storing and configured to be executed by at least the means for computing, wherein at least the program module mechanism is for determining a mask pattern to be used on a photo-mask in a photolithographic process, wherein the photo-mask has a plurality of distinct types of regions having distinct optical properties, at least the program module mechanism including:

instructions for providing a target pattern, wherein the target pattern includes at least one continuous feature having two portions that intersect each other, the two portions having, respectively, a first symmetry axis and a second symmetry axis; and instructions for determining the mask pattern that includes a plurality of distinct types of regions corresponding to the distinct types of regions of the photo-mask, wherein the mask pattern includes a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial mask pattern and the estimate of a wafer pattern to be printed using the photo-mask in the photo-lithographic process, and wherein the gradient is calculated in accordance with a formula obtained by taking a derivative of the function.

20. A computer-implemented method for determining a write pattern to be used by a write device in a semiconductor-manufacturing process, comprising:

providing a target pattern, wherein the target pattern includes at least one continuous feature having two portions that intersect each other, the two portions having, respectively, a first symmetry axis and a second symmetry axis; and determining, using at least one processor in the computer, the write pattern, wherein the write pattern includes instructions for a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial write pattern and the estimate of a wafer pattern to be reading in the photo-lithographic process, and wherein the gradient is calculated in accordance with a formula obtained by taking a derivative of the function.

21. A photo-mask for use in a photolithographic process, wherein the photo-mask has a plurality of distinct types of regions having distinct optical properties, and wherein a mask pattern to which the photo-mask corresponds is determined in a process including the operations of:

providing a target pattern, wherein the target pattern includes at least one continuous feature having two portions that intersect each other, the two portions having, respectively, a first symmetry axis and a second symmetry axis; and determining the mask pattern that includes a plurality of distinct types of regions corresponding to the distinct types of regions of the photo-mask, wherein the mask pattern includes a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial mask pattern and the estimate of a wafer pattern to be printed using the photo-mask in the photo-lithographic process, and wherein the gradient is calculated in accordance with a formula obtained by taking a derivative of the function.

22. A semiconductor wafer, wherein the semiconductor wafer is produced in a photo-lithographic process that includes a photo-mask, wherein the photo-mask has a plurality of distinct types of regions having distinct optical properties, and wherein a mask pattern to which the photo-mask corresponds is determined in a process including the operations of:

providing a target pattern, wherein the target pattern includes at least one continuous feature having two portions that intersect each other, the two portions having, respectively, a first symmetry axis and a second symmetry axis; and determining the mask pattern that includes a plurality of distinct types of regions corresponding to the distinct types of regions of the photo-mask, wherein the mask pattern includes a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial mask pattern and the estimate of a wafer pattern to be printed using the photo-mask in the photo-lithographic process, and wherein the gradient is calculated in accordance with a formula obtained by taking a derivative of the function.

23. A semiconductor wafer, wherein the semiconductor wafer is produced in a semiconductor-manufacturing process that includes a write device using a write pattern, wherein the write pattern is determined in a process including the operations of:

providing a target pattern, wherein the target pattern includes at least one continuous feature having two portions that intersect each other, the two portions having, respectively, a first symmetry axis and a second symmetry axis; and determining the write pattern, wherein the write pattern includes instructions for a first feature and a second feature corresponding to at least the one continuous feature, the first feature having a third symmetry axis which is substantially parallel to the first symmetry axis, the second feature having a fourth symmetry axis which is substantially parallel to the second symmetry axis, wherein the first feature and the second feature are separated by a gap having a length which overlaps at least one of the two portions of at least the one continuous feature proximate to the intersection of the two portions, and wherein the first feature and the second feature substantially overlap at least the one continuous feature, wherein the determining includes calculating a gradient of a function, wherein the function depends on an initial mask pattern and the estimate of a wafer pattern to be printed using the photo-mask in the photo-lithographic process, and wherein the gradient is calculated in accordance with a formula obtained by taking a derivative of the function.

\* \* \* \* \*